(12) United States Patent
Gudmunson et al.

(10) Patent No.: US 7,474,724 B1
(45) Date of Patent: Jan. 6, 2009

(54) METHOD AND SYSTEM FOR VIDEO-SYNCHRONOUS AUDIO CLOCK GENERATION FROM AN ASYNCHRONOUSLY SAMPLED VIDEO SIGNAL

(75) Inventors: Daniel Gudmunson, Dripping Springs, TX (US); John Melanson, Austin, TX (US); Rahul Singh, Austin, TX (US); Ahsan Chowdhury, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 730 days.

(21) Appl. No.: 11/082,347

(22) Filed: Mar. 17, 2005

Related U.S. Application Data

(60) Provisional application No. 60/618,303, filed on Oct. 13, 2004.

(51) Int. Cl.
*H03D 3/24* (2006.01)
(52) U.S. Cl. .................................................. 375/376
(58) Field of Classification Search .................. 375/376
See application file for complete search history.

(56) References Cited

U.S. PATENT DOCUMENTS

| | | | |
|---|---|---|---|
| 4,313,135 A * | 1/1982 | Cooper | 348/512 |
| 4,689,664 A | 8/1987 | Moring et al. | |
| 5,600,379 A * | 2/1997 | Wagner | 348/497 |
| 5,703,537 A * | 12/1997 | Bland et al. | 331/1 A |
| 6,151,076 A * | 11/2000 | Hoffman et al. | 348/512 |
| 6,208,671 B1 | 3/2001 | Paulos et al. | |
| 6,489,901 B1 | 12/2002 | Venkitachalam et al. | |
| 6,642,863 B1 | 11/2003 | Venkitachalam et al. | |

OTHER PUBLICATIONS

Vankka, et al., "A GSM/Edge/WCDMA Modulator With On-Chip D/A Converter for Base Stations", IEEE Transactions on Circuits and Systems, vol. 49, No. 10, Oct. 2002.

* cited by examiner

*Primary Examiner*—Juan A Torres
(74) *Attorney, Agent, or Firm*—Andrew M. Harris; Mitch Harris, Atty at Law, LLC

(57) ABSTRACT

A method and system for video-synchronous audio clock generation from an asynchronously sampled video signal provides a mechanism for maintaining synchronization of audio sampling in digital video-audio systems. A ratio between the sampling clock frequency and an audio reference frequency clock is computed via an all digital phase-lock loop (ADPLL) and an audio clock is generated from the ratio by another PLL or a number to clock converter. In systems where a sampling clock to source video clock ratio has been computed for recovering a video signal, the audio ratio can be computed directly from the video ratio.

20 Claims, 5 Drawing Sheets

METHOD AND SYSTEM FOR VIDEO-SYNCHRONOUS AUDIO CLOCK GENERATION FROM AN ASYNCHRONOUSLY SAMPLED VIDEO SIGNAL

CROSS-REFERENCE TO RELATED APPLICATIONS

This application is related to U.S. provisional application Ser. No. 60/618,303, filed Oct. 13, 2004 and from which it claims benefits under 35 U.S.C. §119(e).

The present application is also related to the following U.S. Patent Applications:

"INVERSE TRACKING OVER TWO DIFFERENT CLOCK DOMAINS" Ser. No. 10/964,556, filed on Oct. 13, 2004, and issued as U.S. Pat. No. 7,355,652 on Apr. 8, 2008; and "METHOD AND SYSTEM FOR SYNCHRONIZING VIDEO INFORMATION DERIVED FROM AN ASYNCHRONOUSLY SAMPLED VIDEO SIGNAL", Ser. No. 11/082,346, filed concurrently herewith.

Each of the above-referenced patent applications has at least one inventor in common with the present application and are assigned to the same assignee. The specifications and drawings of each of the above-referenced patent applications are incorporated herein by reference.

BACKGROUND OF THE INVENTION

1. Field of the Invention

The present invention relates generally to audio/video (AV) systems, and more specifically, to a method and system for generating an audio clock source from a detected video clock rate embedded in a video signal that is sampled asynchronously by a video receiver.

2. Background of the Invention

Digital audio and video systems are prevalent in the areas of home entertainment, professional production of multimedia and computer reproduction and generation of multimedia sources. In particular, systems that record a video stream are frequently coupled to source devices such as cameras and also produced from AV playback devices such as DVD and CD players.

It is necessary to receive, resynchronize and sometimes resample a video signal for recording or processing purposes, whether by a general-purpose computing device, a dedicated video processing device, or a dedicated video recording device. The source video rate may not match the recording or processing video rate, and even if the rates did match, it would be desirable to asynchronously sample the video signal for in order to stabilize the video data to a precision reference clock.

In general, less noise and jitter is generally provided by asynchronously sampling a signal, rather than synchronously sampling a signal, as a very stable local reference clock may be employed. The local reference clock can be designed to minimize environmentally-introduced noise, be ideally terminated to the sample clock input and otherwise be optimized for the video sampling circuit. However, asynchronous sampling of signals with accurate phase preservation requires a high oversampling factor, which is typically impractical for video sources. In particular, the recovery of the synchronization elements in a video signal (such as the luminance and chrominance carriers that require phase accuracy on the order of two degrees or less) would require a sampling clock on the order of 1 GHz in order to completely preserve the video signal.

Traditionally, video clock sources are sampled synchronously with a source-locked video clock. The source-locked video clock used to sample the video signal is generated by a phase-lock loop (PLL) that locks to the incoming line rate, frame rate, or combination of both. While source-locking provides a video clock that is free of drift or "slipping"—at least for relatively clean video signals, video degradation is present in the sampled video due to jitter and other noise that is introduced or cannot be removed by the PLL. In particular, most composite video signals have events such as vertical blanking interval (VBI) that require special circuits in the PLL to avoid disrupting the lock signal and the frequency of the video clock signal of the source may vary from source to source over a fairly wide margin. PLLs that handle such variable signals and disruptive events require a reasonably wide loop bandwidth for capture and lock retention.

To solve this problem with asynchronous sampling while providing its benefits, the above-incorporated patent application "METHOD AND SYSTEM FOR SYNCHRONIZING VIDEO INFORMATION DERIVED FROM AN ASYNCHRONOUSLY SAMPLED VIDEO SIGNAL" provides an asynchronously sampled video reception system and method that do not require a line-locked clock. The disclosed system provides a mechanism for fully-digital recovery of the embedded source clock information, allowing reintroduction of the original synchronization to high-quality asynchronously sampled video.

The above-incorporated patent application further provides the benefit of independent conversion of the incoming video clock rate to another clock rate unrelated to the video source clock.

However, audio information provided in conjunction with a video signal is sampled by an audio subsystem having its own reference clock. Without a means for synchronizing the audio sampling clock (reference audio clock) to the video, drift occurs between audio and video events, eventually leading to perceptible differences that ruin the playback value of recorded multimedia streams.

Further, in digital video-audio processing and recording systems, the desired audio output clock rate may be a different rate than a rate associated with the source video clock or the rate to which the asynchronously sampled video is being converted in the system disclosed in the above-incorporated patent application. Common rates for processing and recording systems are usually based on the CD-Audio or DAT audio standards, with clock rates of 44.1 kHz, 48 kHz, 88.2 kHz, 96 kHz, 192 kHz and the like. The sampled audio is either left in raw mode (PCM) or converted via a codec to a compressed stream at one of the above rates or another dedicated rate.

Therefore, it would be desirable to provide a method and system for generating an arbitrary rate reference audio clock from a video source stream that has been asynchronously sampled.

SUMMARY OF THE INVENTION

The above stated objectives are achieved in a method and system for generating a reference audio clock synchronized with an asynchronously sampled video signal.

A novel circuit computes the ratio of the sampling clock and the audio source clock. A reference audio clock can then be generated from the sampling clock using the ratio to control a PLL clocked by the sampling clock, or via a direct number-to-frequency clock generator circuit.

In systems that compute a source video clock to sampling clock ratio for recovering a source video clock from an asynchronously sampled video signal, such as that described in the above-incorporated patent application, the sampling clock to audio clock ratio can be computed directly from the video clock ratio.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and system that produce a reference audio clock for sampling an audio signal. The reference audio clock is synchronized to a video source clock signal, even though the video signal containing the video source clock signal is sampled asynchronously. The sampled video data is filtered to extract synchronization information, and then a reference audio clock signal is generated in conformity with the extracted synchronization information and a known ratio of the desired reference audio clock frequency to the video clock frequency of the sampled source. In one embodiment of the invention, the ratio between the sampling frequency and the video clock frequency is determined, and the reference audio clock is generated from an audio/video ratio computed from the sampling/video clock ratio. In another embodiment, the sampling clock/audio clock ratio is determined directly.

Because the generation of the reference audio clock is made in a ratiometric fashion, any reference audio output rate can be programmed within the limitations of the implementation, providing flexibility in the audio sampling rate that can be used to capture audio data for encoding along with the sampled video data. The synchronization of the reference audio signal and the sampled video provides that the audio track does not "slip" with respect to the video, so that synchronization is maintained. Thus, the present invention has applicability any time an audio signal is being sampled along with digital capture of a source video signal, and provides benefits in that the video sampling can be carried out asynchronously without losing synchronization between the sampled video and audio information.

Figure 1:
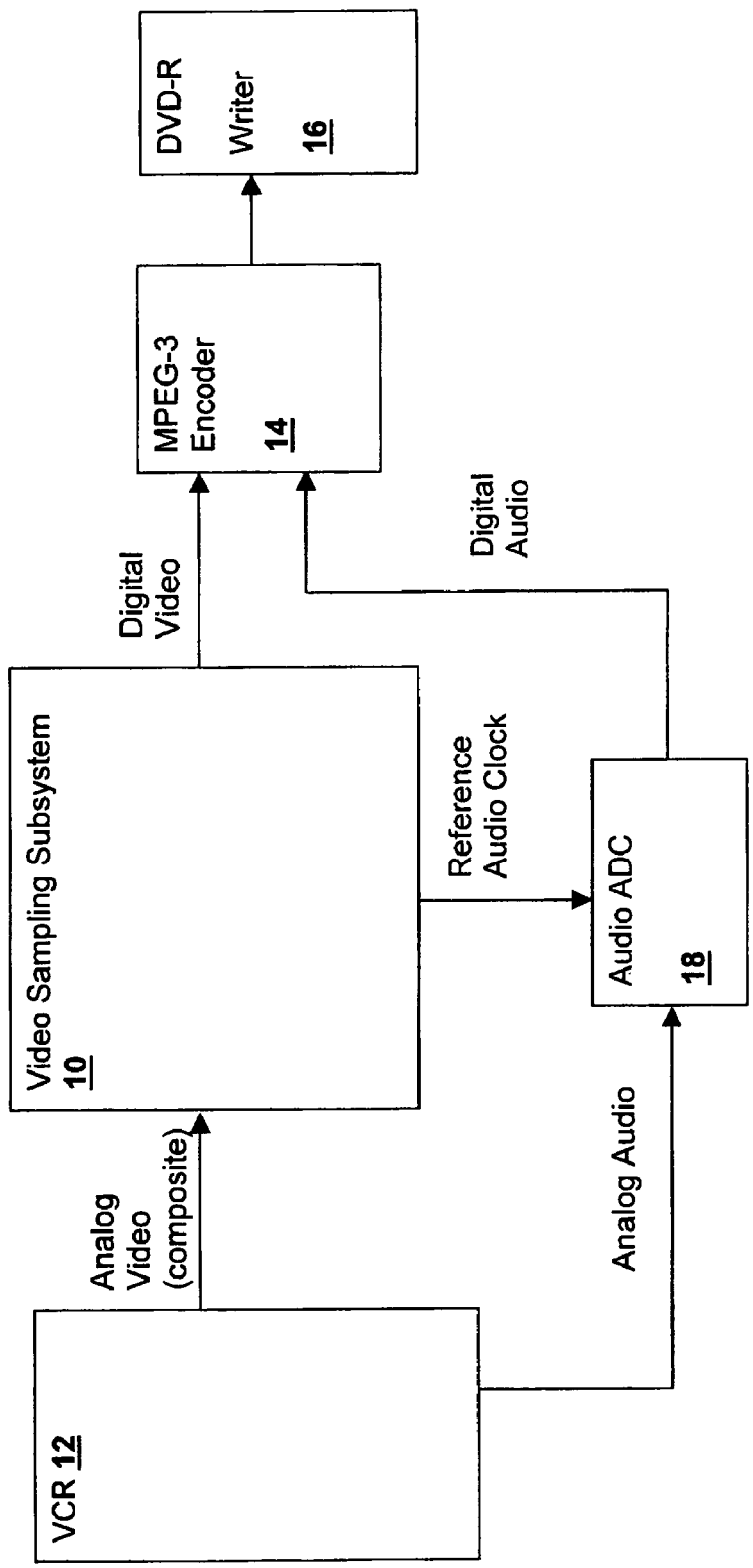
FIG. 1 is a block diagram depicting application of a system 10 in accordance with an embodiment of the present invention.

Referring now to FIG. 1, an application of a video sampling subsystem 10 in accordance with an embodiment of the invention is illustrated. The depicted application is video capture of a video cassette recorder (VCR) 12 output for storage on a digital versatile disc (DVD) via a DVD-R writer 16. Video processing subsystem 10 receives a composite video signal, such as an NTSC or PAL signal from VCR 12, and generates a reference audio clock that is provided to an audio analog-to-digital converter (ADC) 18 which receives the analog audio signals from VCR 12. ADC 18 should be understood to include anti-aliasing filters and data conversion elements to provide a proper digital audio output to MPEG-3 encoder 14, which may be wide parallel data, or a serial signal such as an S/P-DIF signal. Additionally, it should be understood that in place of VCR 12, another input device having a digital audio output that is synchronized to its video signal may be substituted and that the techniques of the present invention apply as well if audio ADC 18 is replaced with a digital audio receiver/sample rate converter.

MPEG-3 encoder 14 receives the sampled digital video produced by video sampling subsystem 10, which may be wide data or a serial digital interface such as DV-I and MPEG-3 encoder bundles the received digital audio and video into an encoded and compressed file stream for storage by DVD-R writer 16.

Figure 2:
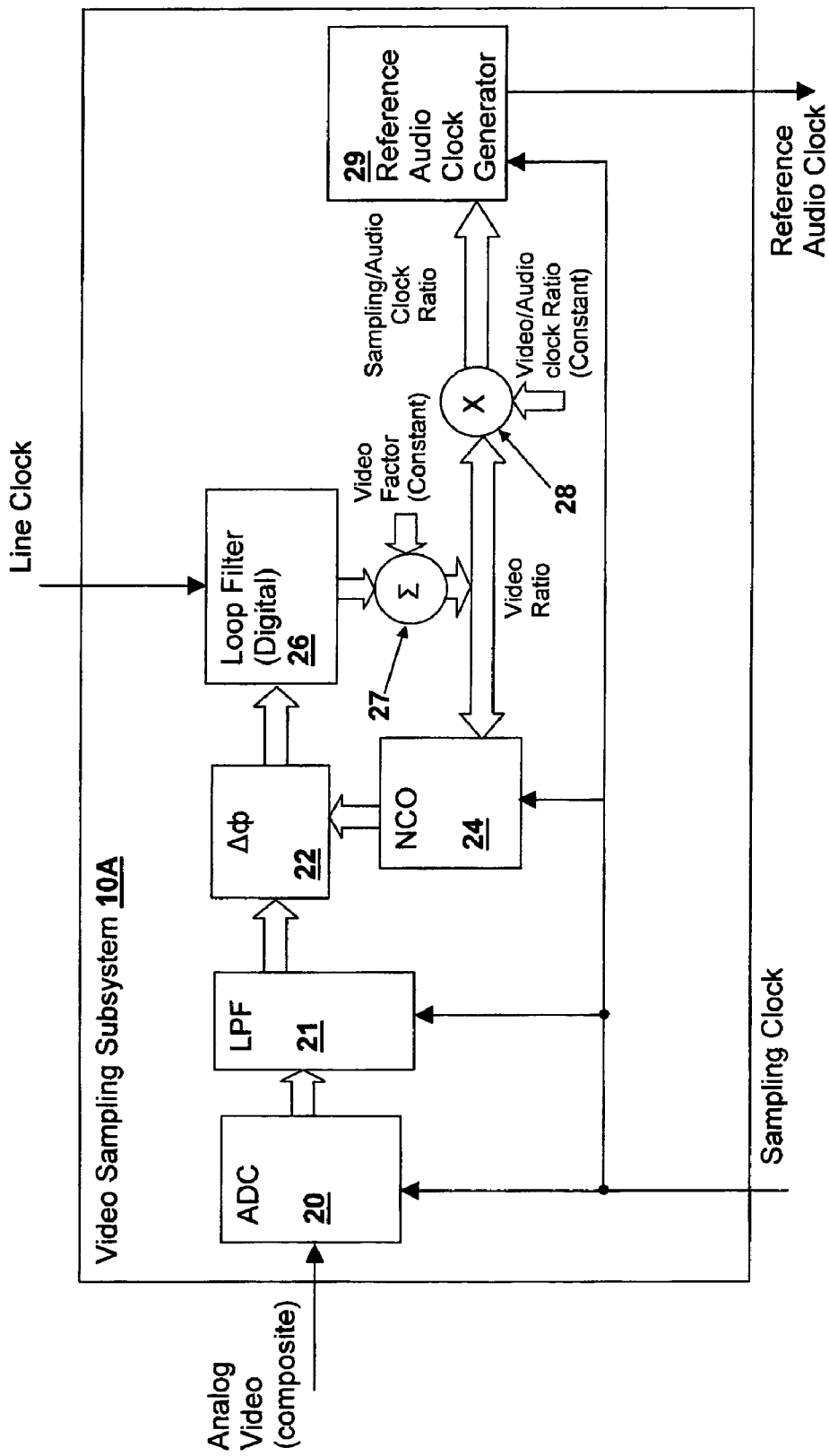
FIG. 2 is a block diagram of a system in accordance with an embodiment of the present invention.

Referring now to FIG. 2, a system 10A, that may be used to implement video sampling subsystem 10 of FIG. 1, is depicted in accordance with an embodiment of the present invention. The analog video input signal is received and converted by an ADC 20 operating at the frequency of a provided sampling clock. The output of ADC 20 is digitally-filtered by low-pass filter (LPF) 21, which removes video and audio information, leaving only synchronization information, which can be at the line rate or the frame rate (or field rate). The filtered data is passed to a phase-detector 22 which compares the phase of the video synchronization data to the digital output of a numerically controlled oscillator (NCO) 24 and provides phase-correction error output to a loop filter 26 that closes the PLL by providing the control input to NCO 24 through an adder 27.

Adder 27 receives a number constituting a video factor that is added to the output of loop filter 26 to generate a frequency offset. The video factor is determined from the known difference between the video source frequency and the sampling frequency and may be adjusted programmatically to adapt to various video rates.

The output of adder 27 is a slowly-varying or essentially constant number corresponding to the ratio between the sampling clock rate and the video clock rate, labeled "video ratio". The video ratio is multiplied by a known factor (constant) representing the ratio of the video clock frequency to the desired reference audio clock frequency by a multiplier 28. The resulting "audio" ratio is the ratio between the sampling clock frequency and the desired reference audio clock rate and the audio ratio is supplied to a reference audio clock generator 29 that produces the reference audio clock. (The reference audio clock frequency will generally be a multiple of the actual audio data sample rate used by ADC 18.)

Loop filter 26 receives a line clock signal derived from other processing circuits that is synchronous with the video source line frequency. The line clock signal is used to synchronize the processing in the loop filter to avoid aliasing error that would occur through phase detector 22 due to the difference between the source video sync rate and the sync rate as sampled and appear as a "beat frequency" at the output of loop filter 26. Such beat frequencies can approach DC values and therefore are eliminated rather than filtered.

Figure 3:
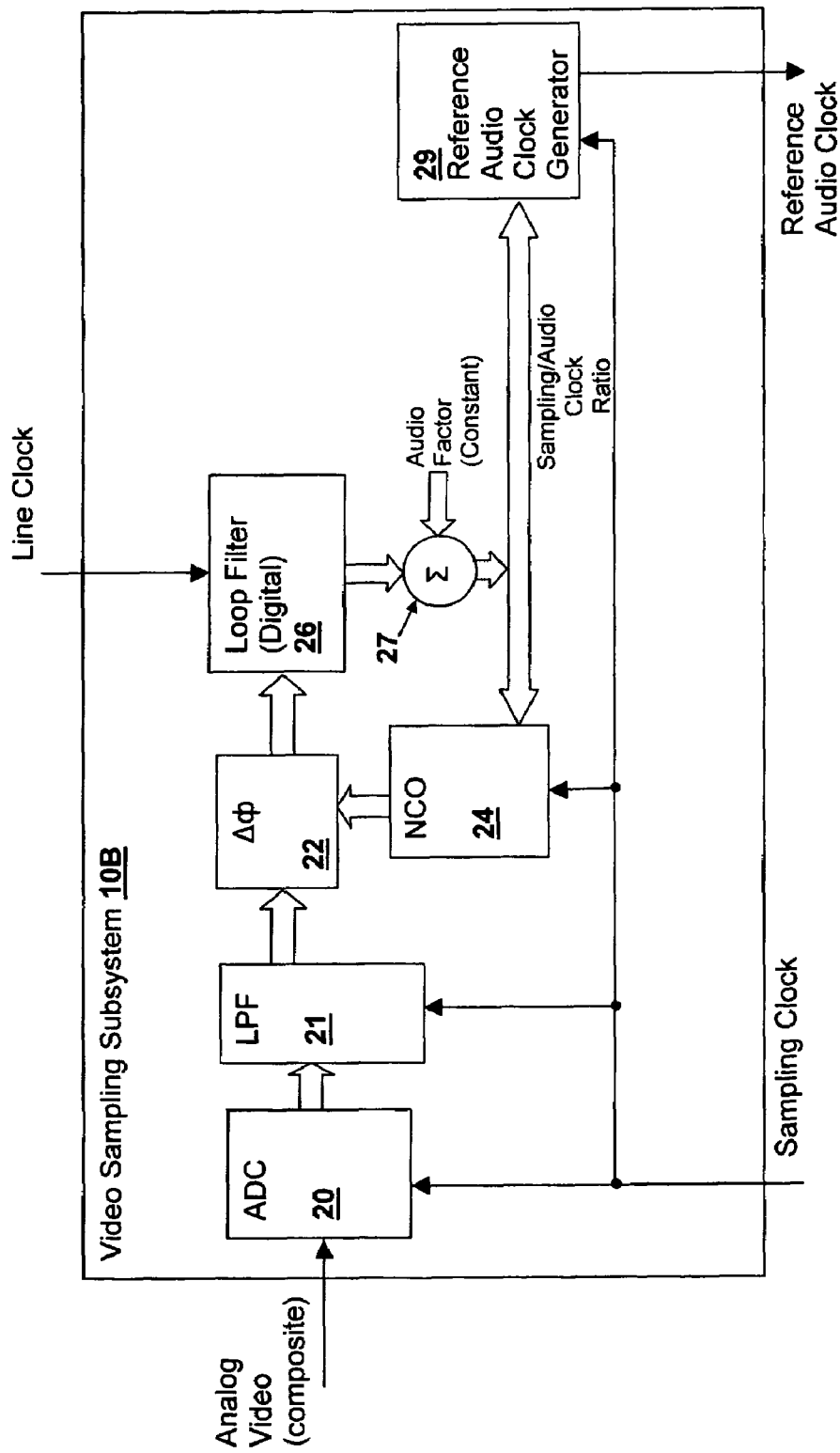
FIG. 3 is a block diagram of a system in accordance with another embodiment of the present invention.

Referring now to FIG. 3, a system 10B in accordance with another embodiment of the invention that may be used to implement video sampling subsystem 10 of FIG. 1 is depicted. Operation of the circuit of FIG. 3 is similar to that described above for the circuit of FIG. 2, and therefore only differences in operation and structure will be pointed out below.

In the circuit of FIG. 3, rather than derive a video ratio, direct conversion of the video source clock rate to the desired reference audio clock rate is achieved. Phase detector 22 compares the output of NCO 24 to generate a number corresponding to the ratio of the sampling clock frequency to the desired reference audio clock frequency at the output of adder 27, rather than the video ratio described above. Adder 27 adds a different factor ("audio factor") than that described above so that the output frequency of NCO 24 is driven to the same video sync rate frequency as is input to phase detector 22 in the operation of the system of FIG. 2. The sampling rate to reference audio clock rate ratio is again input to reference audio clock generator 29, but a multiplier (such as multiplier 28 of FIG. 2) is not required. The circuit of FIG. 3 has applicability when the video ratio is not needed, but a reference audio clock must be generated for sampling audio.

While the above described circuits use a digital NCO 24 and a digital phase detector 22 that receives a waveform representation (generally parallel binary data that represents a ramp signal integrator output for phase-locking with the filtered input video sync data, which is also parallel digital data), other circuit embodiments, both digital and analog are contemplated by the present invention. In particular, NCO 24 may generate an actual signal waveform that is phase compared with either a digital or analog filtered sync signal and NCO may be replaced with a voltage-controlled oscillator (VCO) with an appropriate analog loop filter and analog adders/multipliers, or portions of the above-circuits may be implemented in analog circuits with appropriate A/D or D/A converters between disparate blocks. Also, a digital timebase input to phase detector 22 may be any digital representation of phase, which may be a parallel multi-bit number representing an absolute phase ramp (phase/time ramp) or other numeric indicator of the phase and frequency, such as numbers indicating an edge position and pulse width, etc.

The present invention principally concerns the synchronization of audio sampling with video sampling, and embodiments of the present invention may or may not generate a video clock signal locked to the source video clock and may or may not generate an actual signal corresponding to the desired reference audio clock, as long as the ratio information from which it is obtained can be provided to a numeric oscillator that generates a waveform representation of the reference audio clock. For example, in sample rate converter (SRC) applications where the audio input data is already in a digital format, the SRC input reference clock may be digital numeric data corresponding to a video-synchronized reference audio clock signal, but may require no actual reference audio clock signal to operate, as the converter may use the numeric audio reference clock data to operate interpolators and the SRC circuitry may be "clocked" by the sampling clock instead.

Figure 4:
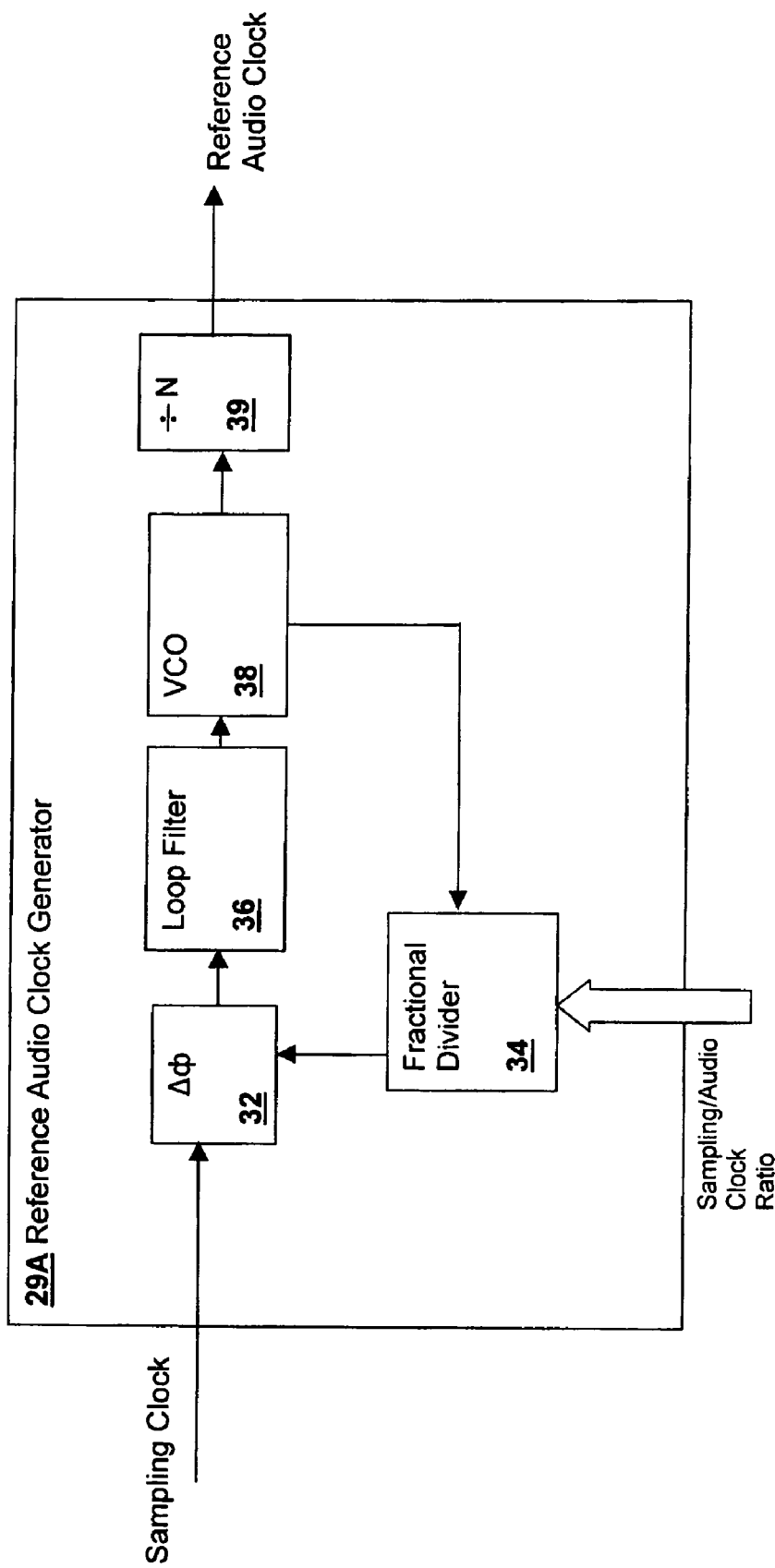
FIG. 4 is a block diagram showing details of an embodiment of reference audio clock generator 29 of FIGS. 2 and 3.

Referring now to FIG. 4, details of a reference audio clock generator 29A that may be used to implement reference audio clock generator 29 of FIGS. 2 and 3 is depicted in a block diagram. The sampling clock signal is passed to a phase-detector 32 which compares the phase of the sampling clock to the digital output of a fractional divider 34, the fractional divider 34 receives the sampling clock/audio clock frequency ratio and divides the output of a voltage controlled oscillator (VCO) 38 to match phase and frequency with the sampling clock input which may be prescaled from the master sampling clock. Fractional divider 34 is a delta/sigma circuit that generates an average pulse signal corresponding to the input (VCO 38 output) value divided by the divisor (audio ratio) value. A loop filter 36 provides the voltage control input to VCO 38 to close the loop, and a divider 39 reduces the rate of VCO 38 output to that of the desired reference audio clock frequency.

Figure 5:
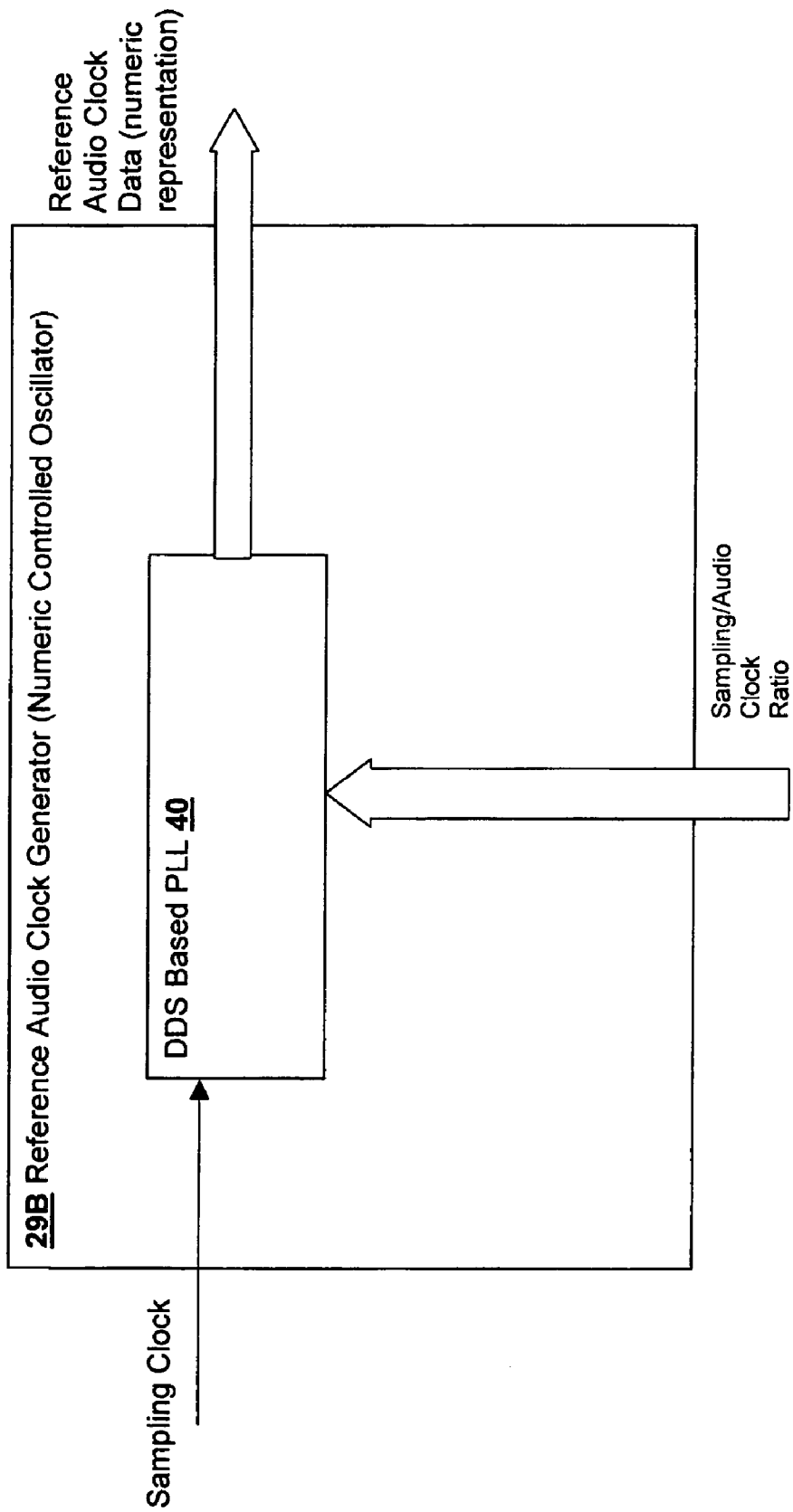
FIG. 5 is a block diagram showing details of an alternative embodiment of reference audio clock generator 29 of FIGS. 2 and 3.

Referring now to FIG. 5, another reference clock audio generator 29B that may be used to implement reference audio clock generator 29 of FIGS. 2 and 3 is shown. Reference audio clock generator 29B consists of a number to clock converter or "numerically controlled oscillator" (NCO) 40 that generates the reference audio clock purely in the digital domain. Generally, NCO will be a direct digital synthesizer (DDS) based PLL that produces a stable reference audio clock signal from the fractional ratio input.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for synchronizing audio data with video data sampled by a fixed sampling clock, said method comprising:
   accepting said video data at an input of a phase detector;
   performing a phase comparison of a video source clock of said video data with a locally-generated timebase;
   filtering a result of said phase comparison;
   computing a first ratio of a frequency of said fixed sampling clock to a second frequency dependent on said video source clock from a result of the filtering; and
   generating an audio synchronization reference for synchronizing said audio data from said first ratio, and wherein a frequency of said fixed sampling clock is independent of any result of said phase comparison.

2. The method of claim 1, wherein said second frequency is a frequency of said video source clock and further comprising computing a second ratio of a frequency of said fixed sampling clock frequency to a frequency of said audio synchronization reference from said first ratio.

3. The method of claim 2, wherein said computing said second ratio comprises multiplying said first ratio by a constant equal to a third ratio of said frequency of said audio synchronization reference to said frequency of said video source clock.

4. The method of claim 1, wherein said second frequency is a frequency of said audio synchronization reference, whereby said first ratio is a ratio of said frequency of said fixed sampling clock to said frequency of said audio synchronization reference.

5. The method of claim 1, wherein said audio synchronization reference is a reference audio clock signal, and wherein said generating comprises providing a number calculated in conformity with said first ratio to a numerically-controlled fractional oscillator, whereby a frequency of said reference audio clock signal is controlled by said first ratio.

6. The method of claim 1, wherein said audio synchronization reference is a numeric audio synchronization representation and wherein said generating comprises providing a number calculated in conformity with said first ratio to a direct digital synthesis phase-lock loop, whereby a frequency of said numeric audio synchronization representation is controlled by said first ratio.

7. The method of claim 1, wherein performing a phase comparison compares a numeric timebase representation with said video source clock and further comprising adjusting a frequency of said numeric timebase representation in conformity with a result of said filtering.

8. The method of claim 1, wherein the phase comparison compares a timebase signal with the video source clock and further comprising adjusting a frequency of the signal in conformity with a result of said filtering.

9. The method of claim 1, further comprising filtering said video data with a digital low-pass filter to remove video information while retaining video synchronization information, whereby said performing a phase comparison compares a frequency of said video synchronization information to a frequency of said locally-generated timebase.

10. The method of claim 1, wherein said filtering is performed by a digital filter clocked by a reconstructed version of said video source clock.

11. A circuit for synchronizing audio data with video data sampled by a fixed-frequency sampling clock, comprising:
 a video data input for receiving said video data;
 a local timebase;
 a phase detector coupled to said video data input and said local timebase for comparing a video source clock derived from said video data to said local timebase;
 a loop filter for filtering an output of said phase detector and providing an input to said local timebase, whereby said local timebase is phase-locked to said video source clock; and
 a ratio generator coupled to said loop filter for generating a first ratio of a frequency of said fixed-frequency sampling clock to a second frequency dependent on said video source clock, whereby said audio data can be synchronized to an audio synchronization reference generated in conformity with said first ratio, and wherein a frequency of said fixed-frequency sampling clock is independent of any output of said phase detector.

12. The circuit of claim 11, wherein said second frequency is a frequency of said video source clock and further comprising a second ratio generator for computing a second ratio of a frequency of said fixed sampling clock frequency to a frequency of said audio synchronization reference from said first ratio.

13. The circuit of claim 12, wherein said second ratio generator comprises a multiplier for multiplying said first ratio by a constant equal to a third ratio of said frequency of said audio synchronization reference to said frequency of said video source clock.

14. The circuit of claim 11, wherein said second frequency is a frequency of said audio synchronization reference, whereby said first ratio is a ratio of said frequency of said fixed sampling clock to said frequency of said audio synchronization reference.

15. The circuit of claim 11, wherein said audio synchronization reference is a reference audio clock signal, and wherein said circuit further comprises a numerically-controlled fractional oscillator that receives said ratio as a frequency control input and produces said reference audio clock signal as an output, whereby a frequency of said reference audio clock signal is controlled by said first ratio.

16. The circuit of claim 11, wherein said audio synchronization reference is a numeric audio synchronization representation and wherein said circuit further comprises a direct digital synthesis phase-lock loop that receives said ratio as a frequency control input and produces said numeric audio synchronization representation as an output, whereby a frequency of said numeric audio synchronization representation is controlled by said first ratio.

17. The circuit of claim 11, wherein said local timebase is a numeric oscillator having a digital frequency control input coupled to said ratio generator for adjusting a frequency of said local timebase.

18. The circuit of claim 11, wherein said local timebase is an oscillator providing a clock output to an input of said phase detector.

19. The circuit of claim 11, further comprising a digital low-pass filter having an input coupled to said video data input for removing video information while retaining video synchronization information, and having an output coupled to said phase detector, whereby said phase detector compares a frequency of said video synchronization information to a frequency of said locally-generated timebase.

20. The circuit of claim 11, wherein said loop filter is a digital filter clocked by a reconstructed version of said video source clock.

* * * * *